(12) United States Patent
Yamazaki et al.

(10) Patent No.: US 6,242,343 B1
(45) Date of Patent: *Jun. 5, 2001

(54) PROCESS FOR FABRICATING SEMICONDUCTOR DEVICE AND APPARATUS FOR FABRICATING SEMICONDUCTOR DEVICE

(75) Inventors: Shunpei Yamazaki, Tokyo; Satoshi Teramoto, Kanagawa, both of (JP)

(73) Assignee: Semiconductor Energy Laboratory Co., Ltd., Kanagawa-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/794,879

(22) Filed: Feb. 5, 1997

(30) Foreign Application Priority Data

Feb. 5, 1996 (JP) .................................................. 8-042149

(51) Int. Cl.[7] .............................................. H01L 21/4763

(52) U.S. Cl. ........................ 438/633; 438/691; 438/692; 451/41

(58) Field of Search ................................. 438/633, 626, 438/692, 691, 690, 720; 451/36, 41, 285

(56) References Cited

U.S. PATENT DOCUMENTS

| 5,391,258 | * | 2/1995 | Brancaleoni et al. | 156/636 |
|---|---|---|---|---|
| 5,562,529 | * | 10/1996 | Kishii et al. | 451/36 |
| 5,567,300 | * | 10/1996 | Datta et al. | 205/652 |
| 5,575,706 | * | 11/1996 | Tsai et al. | 451/41 |
| 5,616,934 | * | 4/1997 | Dennison et al. | 257/67 |
| 5,658,806 | * | 8/1997 | Lin et al. | 438/157 |
| 5,807,165 | * | 9/1998 | Uzoh et al. | 451/41 |

FOREIGN PATENT DOCUMENTS 7-130848    5/1995   (JP) .

* cited by examiner

*Primary Examiner*—Caridad Everhart
(74) *Attorney, Agent, or Firm*—Fish & Richardson

(57) ABSTRACT

A process for fabricating a semiconductor device having a multilayer wiring, comprising steps of: forming a first wiring or electrode on a substrate; forming an insulating film which covers the first wiring or electrode; forming a contact hole to the first wiring or electrode through the insulating film; forming a wiring for contacting the first wiring or electrode inside the contact hole; and removing the protruded portion of the contact wiring and flattening the insulating film at the same time in an electrolytic solution by means of chemical mechanical polishing using the contact wiring as the anode. Also claimed is an apparatus for polishing the surface of a semiconductor device during its fabricating the device, comprising: means for performing chemicomechanical polishing; and means for supplying electric current to the electrode of the semiconductor device.

29 Claims, 3 Drawing Sheets

PROCESS FOR FABRICATING SEMICONDUCTOR DEVICE AND APPARATUS FOR FABRICATING SEMICONDUCTOR DEVICE

BACKGROUND OF THE INVENTION

1. Field of the Invention

The present invention relates to a process for fabricating semiconductor device having a multilayer wiring structure. More particularly, the present invention relates to a technique for flattening a base layer on which the wiring is formed.

2. Description of the Related Art

In recent years, to increase the degree of integration in semiconductor integrated circuits, study for a constitution which increases not only the two-dimensional, but the three-dimensional degree of integration is being studied. A multilayer wiring is necessary to increase the three-dimensional degree of integration.

However, with an increase in the number of superposed layer of wiring, inevitably increases the surface roughness, and hence problems arise in which, for instance, relaxation of the design rule is required as the formation of layers progress to the upper layer.

As a method for overcoming the problem above, there is a known technique disclosed in Japanese Unexamined Patent Application in which the surface of a multilayer wiring is flattened.

It is still difficult, however, to flatten, as a whole, an interlayer insulating film having surface irregularities and the electrodes and wirings that protrude from the contact hole formed on the interlayer insulating film.

For instance, when a multilayer structure as shown in FIG. 3 comprising two layers of electrodes or wirings is formed, the surface thereof includes the irregularities of the interlayer insulating film 301 and the irregularities caused by the wirings or electrodes 302 to 304 having contacts with the lower wiring.

Such irregularities become obstacles in case a multilayer wiring is to be formed further thereon. However, it is difficult to wholly flatten such irregularities.

Further, from the problem of covering the inside of the contact holes for the electrodes 302 to 304, disconnections and contact failure occur on the side planes inside the contact hole 300.

To overcome the above problem, it is necessary to form the electrode material thick so enough as to fill the inside of the contact hole with a material constituting the electrode. However, if such a measure is taken, the electrode itself becomes a large protrusion, and brings about a novel problem ascribed thereto.

SUMMARY OF THE INVENTION

An object of the present invention is to solve the problems of the irregularities being formed during the fabrication of a multilayer wiring, which are attributed to the presence of lower layer wiring. It is also an object of the present invention to provide a technique capable of flattening, as a whole, the irregularities of the interlayer insulating film and those attributed to the presence of the upper layer wiring itself.

According to an aspect of the present invention, there is provided a process for fabricating a semiconductor device having a multilayer wiring structure, characterized by comprising the steps of: forming a first wiring or electrode on a substrate; forming an insulating film which covers the first wiring or electrode; forming a contact hole to the first wiring or electrode through the insulating film; forming a wiring for contacting the first wiring or electrode inside the contact hole; and removing the protruded portion of the contact wiring and flattening the insulating film at the same time in an electrolytic solution by means of chemical mechanical polishing using the contact wiring as the anode.

According to another aspect of the present invention, there is provided a process for polishing the surface of a semiconductor device during its fabrication, characterized by comprising performing electrolytic polishing using the electrode of the semiconductor device as the anode while performing chemical mechanical polishing at the same time.

In accordance with still another aspect of the present invention, there is provided an apparatus for fabricating a semiconductor device, comprising: means for mechanically polishing the surface of a semiconductor device during its fabrication; and means for supplying electric current to the electrode of the semiconductor device.

In accordance with yet another aspect of the present invention, there is provided an apparatus for polishing the surface of a semiconductor device during its fabrication, characterized by comprising: means for performing chemical mechanical polishing; and means for supplying electric current to the electrode of the semiconductor device.

According to the present invention disclosed in the specification, an electrolytic solution having an electric resistance in a range of from $10^{-3}$ to $10^{10}$ $(\Omega \cdot cm)^{-1}$ is used.

Also, electrically non-conductive particles having a granularity in a range of from number 4,000 to 10,000 are used as the chemical mechanical polishing material.

By using an electrically non-conductive material for the polishing material, the phenomenon of selectively removing the electrode can be prevented from occurring.

Further, by using an electrically non-conductive material as the polishing material, the problem of causing short circuit due to the presence of a conductive material during the fabrication steps of integrated circuits of a multilayer structure can be suppressed.

A material selected from the group consisting of diamond particles, alumina particles, carbon particles, and silica particles can be used as the electrically non-conductive material.

DETAILED DESCRIPTION OF THE PREFERRED EMBODIMENT

Figure 1A:
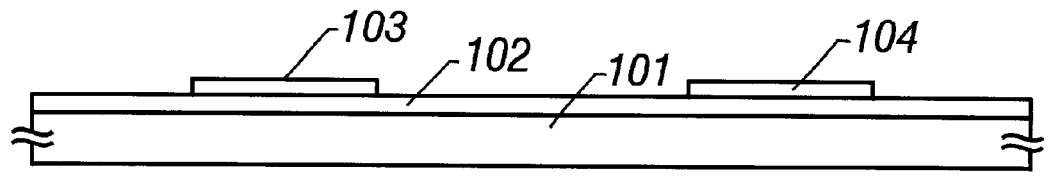
FIGS. 1 (A) to 1 (D) schematically show a process for fabricating a semiconductor device having a multilayer wiring according to an embodiment of the present invention.
Figure 1B:
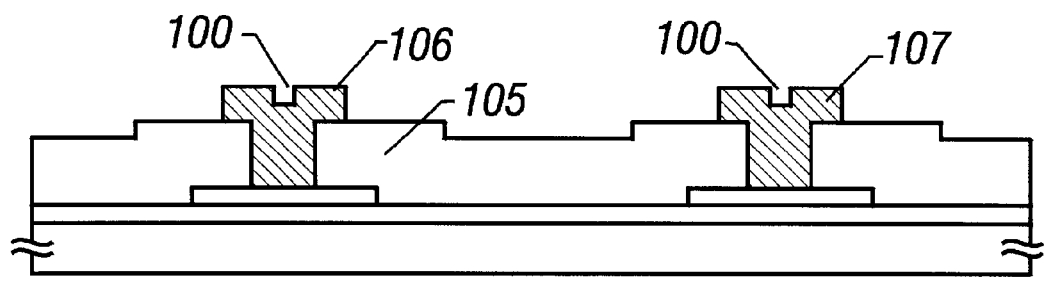
Figure 1C:
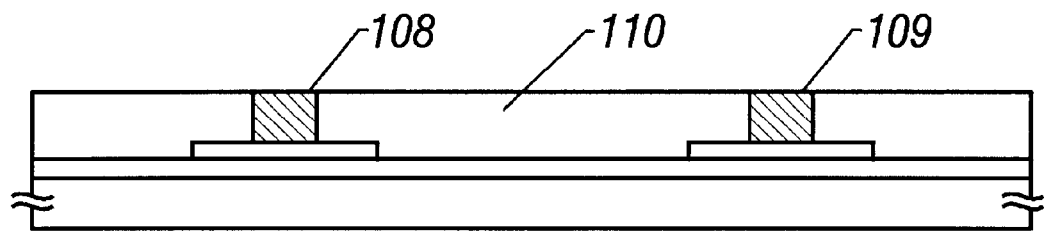
Figure 1D:
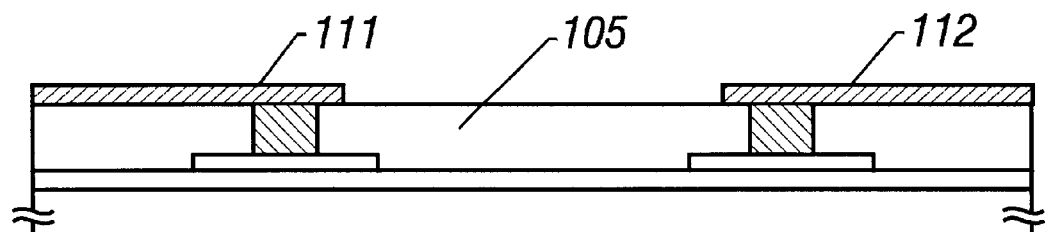

The present invention is described in further detail below with reference to the accompanying drawings.

EXAMPLE 1

The present Example describes the details of a process for fabricating a constitution according to the present invention in which the wiring of a first layer is connected with the wiring of a second layer constituting a multilayer wiring. FIGS. 1 (A) to 1 (D) show the fabrication process of a multilayer wiring in accordance with the present example.

A silicon oxide film 102 was formed as a base insulating film on a substrate 101 at a thickness of 4,000 Å by means of plasma CVD.

A single crystal silicon substrate or a glass substrate can be used for the substrate 101. Otherwise, substrates made of other metals or semiconductor substrates, or a proper insulating substrate can be used.

In case a single crystal substrate is used, a MOS type element and the like is formed in the substrate. Further, in case a glass substrate or a quartz substrate is used, a TFT (thin film transistor) using a thin film semiconductor is formed.

As the base film, a silicon oxide film or a silicon nitride film formed by plasma CVD can be used. Furthermore, a silicon oxynitride film can be used.

After forming a silicon oxide film 102 as the base film, an aluminum film (not shown) for forming the wiring for the first layer was formed to a thickness of 5,000 Å by means of sputtering. A rare earth element such as scandium or copper was added into the aluminum film to prevent the generation of hillocks and whiskers.

Then, by patterning the aluminum film not shown in the figure, wirings or electrodes 103 and 104 were formed for the first layer. Thus was obtained a structure shown in FIG. 1 (A).

Although FIG. 1 (A) shows only the wirings or electrodes 103 and 104, in general, the necessary wirings or electrodes are placed at a required pattern.

An interlayer insulating film 105 was formed thereafter. A silicon oxide film, a silicon nitride film, or a silicon oxynitride film as well as a resin film can be used for the interlayer insulating film 105. Furthermore, a multilayer film of the films above can be used in place of a single layer film. A PSG film can be used because of its excellent planarity.

Referring to FIG. 1 (B), it can be seen that, in general, a completely flat surface cannot be obtained on an interlayer insulating film 105.

After forming the interlayer insulating film 105, an opening reaching the wirings or electrodes 103 and 104 was formed. The wirings or electrodes 103 and 104 were exposed at the bottom portion of the opening.

Then, the naturally oxidized film (aluminum oxide) that is formed on the surface of the wirings or electrodes 103 and 104 being exposed at the bottom portion of the opening was removed. In general, a naturally oxidized film is formed, although very thinly, on the surface of an aluminum film. Accordingly, in case of forming a contact, a step of removing the naturally oxidized film is requisite.

Subsequently, although not shown in the figure, a 5,000-Å-thick aluminum film was formed by sputtering to constitute contacts to the wirings or electrodes of the second layer. By patterning the thus formed aluminum film, a structure shown in FIG. 1 (B) was obtained.

In the state shown in FIG. 1 (B), the wirings 106 and 107 for contacts are provided in the form of protrusions.

In general, concave portions 100 corresponding to the depressions of contact holes are formed on the upper portions of the wirings 106 and 107 for contacts. The concave portions 100 greatly influence the flatness of an interlayer insulating film being formed further on the upper side thereof.

After a state shown in FIG. 1 (B) is obtained, polishing using an apparatus described hereinafter and shown in FIG. 2 was performed by using a mixture of silica sol and an electrolytic solution for use in chemical mechanical polishing (CMP).

In this Example, polishing was performed in an electrolytic solution using the wirings 106 and 107 as the anodes while applying a pressure of 100 kg/cm² from the polishing pad. The pressure applied during polishing can be selected from a range of from about 50 to 150 kg/cm². Polishing is performed by taking a gap of 0.1 µm between the surface of a sample and a polishing pad.

In this process step, polishing is performed in two modes. One is polishing known as chemical mechanical polishing (CMP). Polishing in this mode is effected by silica grains being mixed into the electrolytic solution.

In another mode, mainly the protruded portions of the wirings 106 and 107 are selectively polished by electrolytic polishing using the protruded wirings 106 and 107 as the anodes.

Further, because adsorbed charge (OH—) is present on the surface of the silica grains, CMP proceeds more actively on the protruded porions of the wirings 106 and 107. That is, the silica grains which are used in CMP are attracted to the protruded portions of the wirings 106 and 107 as to selectively proceed the polishing process.

Thus, a flattened interlayer insulating film 110 shown in FIG. 1 (C) was obtained by progressive polishing described above. Further, contact wirings 108 and 109 having a continuous flattened surface with the exposed portion of the interlayer insulating film 110 were obtained in this step.

A planarity with a roughness of 1,000 Å or less is obtained in this state.

In a process using CMP alone, in general, it is difficult to use a wholly flattened surface shown in FIG. 1, because the polishing rate for an interlayer insulating film 105 differs from that for wirings 106 and 107. Conventionally, CMP using polishing materials in a large quantity has been applied for a long duration of time to overcome the aforementioned difficulty.

It should be noted that in case of using the electrolytic polishing only, the electrically conductive material usable as the anode alone is selectively polished as to make the polishing of an insulating material such as the interlayer insulating film and the like difficult. Accordingly. it becomes difficult to flatten the entire structure.

Subsequently, wirings or electrodes 111 and 112 for the second layer were formed after a state having a flattened surface was obtained. The wirings or electrodes 111 and 112 can be formed by using the same material used for the wirings or electrodes 103 and 104 for the first layer. As a matter of course, they may be provided by using different materials.

Thus was obtained a state shown in FIG. 1 (D). Thus was realized a multilayer wiring having a constitution with two layers. To form a multilayer wiring with more layers, a second interlayer insulating film is formed superposed on the state shown in FIG. 1 (D) to form wirings for the third layer according to the process steps illustrated in FIGS. 1 (B) and 1 (C).

Because all of the layers can be surely flattened by adopting the constitution according to the present Example, a state having difficulty in fabrication, such as the occurrence of breakage in wirings, can be circumvented even in case the wirings are formed in a plurality of layers. Thus, it enables a multi-lever structured semiconductor integrated circuit having a high degree of integration.

EXAMPLE 2

The present Example refers to an apparatus for performing polishing which was used in the fabrication process described in Example 1. In the polishing apparatus referred in the present invention, a mechanochemical polishing and an electric polishing can be carried out at the same time.

Figure 2:
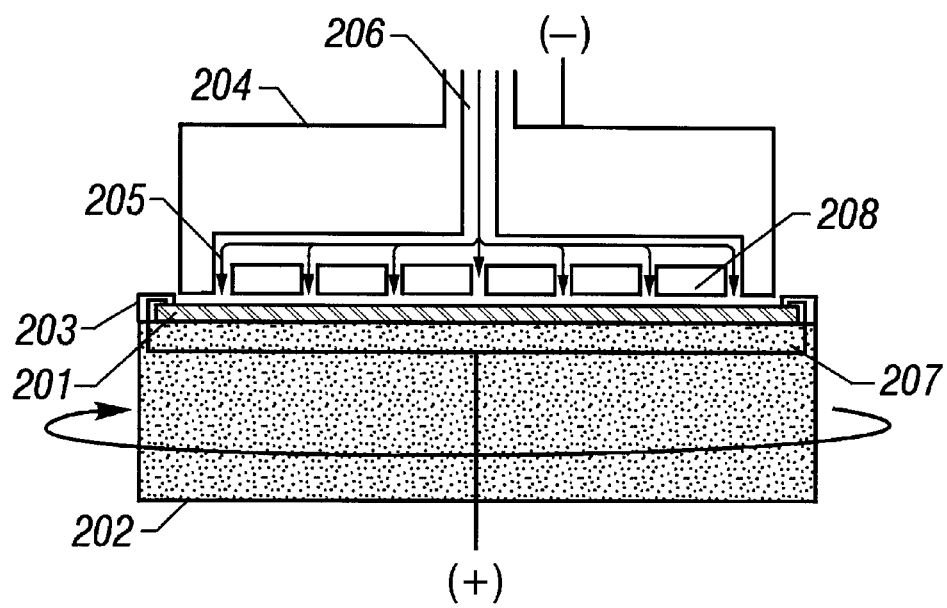
FIG. 2 schematically shows an apparatus for polishing a semiconductor device according to an embodiment of the present invention.
Figure 3:
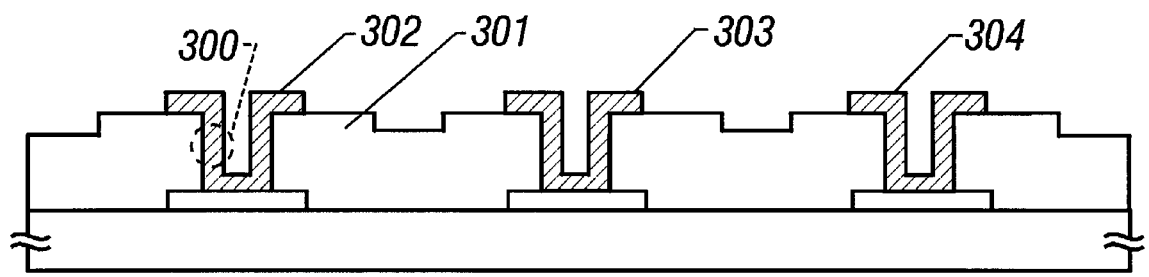
FIG. 3 schematically shows a conventional process for fabricating a semiconductor device having a multilayer wiring.
Figure 4A:
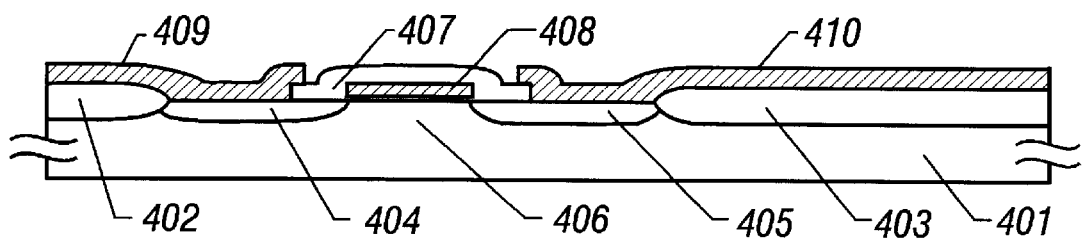
FIGS. 4 (A) to 4 (D) schematically shows a process for fabricating a semiconductor device having a multilayer wiring according to another embodiment of the present invention.
Figure 4B:
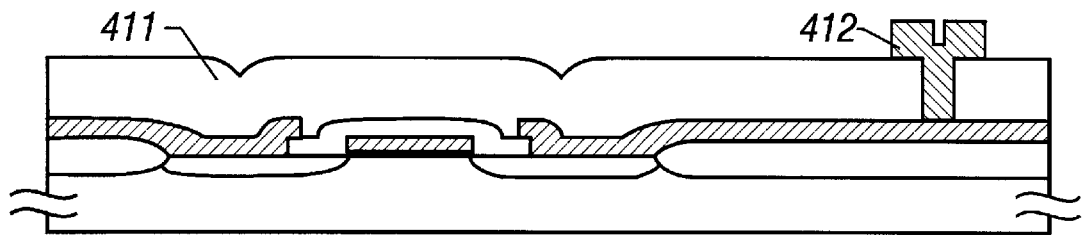
Figure 4C:
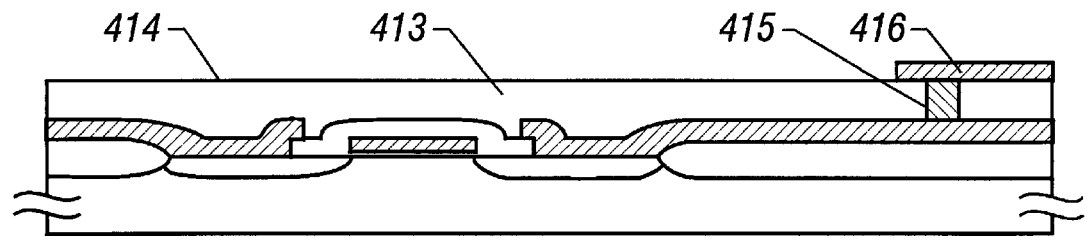
Figure 4D:
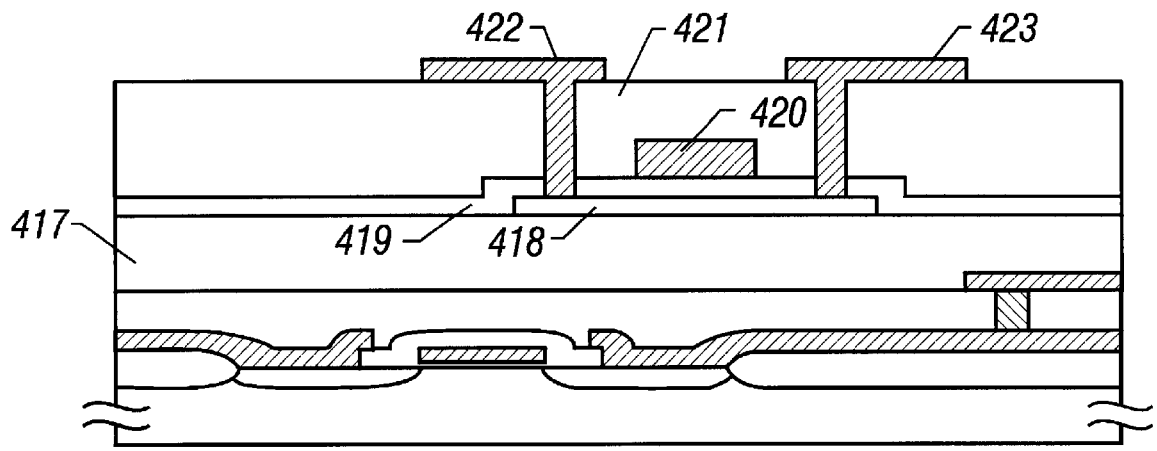

FIG. 2 shows the outline of the polishing apparatus according to the present Example. Referring to FIG. 2, a sample 201 is, for instance, a silicon wafer, a glass substrate, etc., on which a semiconductor device or a multilayer wiring is to be formed (or is already formed).

Referring to FIG. 2, a wiring 207 necessary for supplying anodic current in carrying out electrolytic polishing is provided. The wiring 207 supplies an anodic current to an electrode formed on the sample from a jig 203 for fixing the sample 201 on a stage 202.

In the present Example, the stage 207 on which the sample 201 is placed rotates in such a manner that the sample 201 is rotated relative to the polishing jig 204. The surface of the sample 201 is thus polished by rotating the stage 207.

A polishing jig 204 comprising a polisher cloth 208 placed on the surface that is brought into contact with the surface of the sample 201. In the present Example, the polishing jig 204 is fixed in such a manner that it may polish the surface of the rotating sample 201 while applying a predetermined pressure to the sample 201.

The polishing jig 204 further comprises a plurality of openings 205, so that an electrolytic solution 206 containing the polishing material may be uniformly supplied to the entire surface of the sample.

The polishing jig 204 is made of an electrically conductive material, and the jig itself functions as a cathode. in polishing the sample 201.

In case of polishing the surface of the sample 201, the stage 202 rotates with respect to the polishing jig 204 while supplying the electrolytic solution containing the polishing material from the openings 205. Chemical mechanical polishing (CMP) is performed in this manner. Electrolytic polishing is carried out at the same time by using the electrode formed on the sample 201 as the anode and the polishing jig 204 as the cathode.

Thus, with the constitution above, the surface of the sample is flattened by proceeding CMP and an electrolytic polishing at the same time.

EXAMPLE 3

The present Example relates to a process for fabricating an integrated circuit having a multilayer structure comprising an ordinary MOS type semiconductor device using a silicon wafer and a thin film transistor fabricated thereon.

FIGS. 4 (A) to 4 (D) schematically show a process for fabricating an integrated circuit according to the present Example. First, a P-channel type MOS semiconductor device was fabricated on a silicon wafer 401 by following a known process for fabricating a MOS transistor (FIG. 4 (A)).

In FIGS. 4 (A) to 4 (D), P-type regions 402 and 403 as well as N-type regions which function as source and drain regions are provided on a single crystal silicon wafer 401. A channel forming region 406 under a gate electrode 408 is also formed. A silicon oxide film 407 placed just under the gate electrode 408 functions as the gate insulating film.

A source electrode or a source wiring 409 made of a metallic material or an N-type silicon material is present. A drain electrode or drain wiring 410 also constitutes the structure.

After obtaining a state shown in FIG. 4 (A), a silicon oxide film was formed as an interlayer insulating film 411. Other materials or a multilayer film can be used for the interlayer insulating film.

A contact hole was formed after forming the interlayer insulating film 411, and an electrode 412 which contacts with a drain electrode or drain wiring 410 was formed. Thus was obtained a state shown in FIG. 4 (B).

In this state, the surface of the interlayer insulating film 411 includes irregularities ascribed to the presence of a MOS type transistor formed thereunder. To surely make contact at the bottom portion of the contact hole of the contact electrode 412, the film constituting the electrode 412 must be provided sufficiently thick. Thus, the electrode 412 was provided in such a shape that a concave portion is present at the central portion thereof.

After a state shown in FIG. 4 (B) is obtained, polishing shown in Example 1 was performed to flatten the surface. In this step, the protruded portion of the electrode 412 is flattened by electrolytic polishing, while removing the surface irregularities from the interlayer insulating film 411 by CMP at the same time.

Thus was obtained an interlayer insulating film 413 having a flat surface 414 as shown in FIG. 4 (C). A contact electrode 415 whose protruded portion was removed by polishing was formed on approximately the same plane (or, on a state very similar thereto) as that of the surface of the interlayer insulating film 413.

Subsequently, a wiring 416 which contacts with the contact electrode 415 was formed. By taking such a constitution, the film thickness of the wiring can be reduced as possible while assuring complete contact of the wiring 416 with the drain electrode or drain wiring 410. Thus, sure contact can be formed while yet minimizing the irregularities that are inevitably formed later by the presence of the wiring 416.

A state shown in FIG. 4 (C) was thus obtained. A second interlayer insulating film 417 was formed thereafter. The second interlayer insulating film is formed from a silicon oxide film or a silicon nitride film. Otherwise, a resin film as well as a multilayer film of the aforementioned films can be used for the second interlayer insulating film.

In the present example, the surface of the interlayer second insulating film 417 is polished by using an apparatus shown in FIG. 2. Incidentally, because no electrically conductive material is exposed, no electrolytic polishing is effected in this case.

A thin film transistor is further formed on the second interlayer insulating film 417. A 1,500-Å-thick amorphous silicon film (not shown) which constitutes the starting film of the active layer for forming a thin film transistor was formed at first.

Subsequently, the amorphous silicon film above (not shown) was crystallized by performing heating treatment at 850° C. for 5 hours. Thus obtained crystallized silicon film is patterned to thereby obtain an active layer 418 made from a crystalline silicon film.

A silicon oxide film as a gate insulating film 419 was formed thereafter by means of thermal oxidation or plasma CVD, or by a combination thereof.

Furthermore, a gate electrode 420 was formed by using a metallic material or a silicide material. Thereafter, impurity ions were implanted by using the gate electrode 420 as a mask to form a source region and a drain region in the active layer 418.

Thereafter, thus implanted impurity ions were activated and the regions comprising the implanted impurity ions were annealed by irradiating a laser light or heating treatment.

Next, an insulating film comprising a silicon oxide film or the like is formed to provide an interlayer insulating film 421. Furthermore, after forming a contact hole, a source electrode (or wiring) and a drain electrode (or wiring) are formed.

Thereafter, a flattening step shown in FIG. 4 (C) is optionally performed, and further a multilayer structure is fabricated.

In this manner, a semiconductor integrated circuit having a multilayer structure can be obtained by forming a thin film transistor after fabricating a MOS-type semiconductor device using a single crystal silicon wafer. Because the base for the thin film transistor to be formed thereon can be flattened in this constitution, a high degree of integration can be achieved.

EXAMPLE 4

The present example refers to a process which comprises performing polishing in two or three stages in order to obtain a higher degree of flatness. In this case, it is preferred to use a plurality of polishing apparatuses depending on the degree of polishing.

In case a mode of electrolytic polishing is present as one of the polishing modes as disclosed in the present invention, the polishing state differs depending on the electric insulation properties of the polishing material. Accordingly, the surface flatness of the resulting sample can be controlled by performing polishing using a plurality of polishing materials for a plural times.

In the present example, a more favorable flatness as a result of polishing is achieved by polishing a single sample continuously using a plurality of polishing apparatuses.

As described in detail above, the present invention provides a flat exposed surface in the fabrication process of a semiconductor device having a multilayer structure. Thus, in case of fabricating a semiconductor device having a multilayer structure, the problem of irregularities ascribed to the presence of the lower layer wirings can be overcome.

While the invention has been described in detail and with reference to specific embodiments thereof, it will be apparent to one skilled in the art that various changes and modifications can be made therein without departing from the spirit and scope thereof.

What is claimed is:

1. A process for fabricating a semiconductor device having a multilayer wiring, comprising the steps of:
   forming a first wiring or electrode on a substrate;
   forming an insulating film which covers the first wiring or electrode and has surface irregularities;
   forming a contact hole to the first wiring or electrode through the insulating film;
   forming a wiring havinq a protruded portion for contacting the first wiring or electrode inside the contact hole; and
   removing the protruded portion of the contact wiring and flattening the insulating film at the same time in an electrolytic solution by means of chemical mechanical polishing and electrolytic polishing using the contact wiring as an anode.

2. A process according to claim 1, wherein electric resistance of the electrolytic solution is in a range of from $10^3$ to $10^{10}$ $(\Omega \cdot cm)^{-1}$.

3. A process according to claim 1, wherein electrically non-conductive particles having a granularity in a range of from number 4,000 to 10,000 are used for the chemical mechanical polishing.

4. A process according to claim 3, wherein the electrically non-conductive particles are selected from diamond particles, alumina particles, carbon particles, and silica particles.

5. A process for fabricating a semiconductor device comprising:
   forming a MOS transistor in a silicon substrate;
   forming a first insulating film over said MOS transistor;
   forming a hole in said first insulating film;
   forming a contact electrode which is connected with said MOS transistor through said hole;
   flattening a surface of said contact electrode and a surface of said first insulating film at the same time by electrolytic polishing and chemical mechanical polishing using said contact electrode as an anode;
   forming a wiring over said contact electrode and said first insulating film and in contact with said contact electrode;
   forming a second insulating film over said wiring and said first insulating film;
   polishing a surface of said second insulating film by chemical mechanical polishing; and
   forming a thin film transistor over said surface of said second insulating film after said polishing.

6. The process of claim 5 wherein said base surface has irregularities before said polishing.

7. A process for fabricating a semiconductor device comprising:
   forming a MOS transistor in a silicon substrate;
   forming a first insulating film over said MOS transistor;
   forming a hole in said first insulating film;
   forming a contact electrode which is connected with said MOS transistor through said hole;
   flattening a surface of said contact electrode and a surface of said first insulating film at the same time by chemical mechanical polishing in an electrolytic solution using said contact electrode as an anode;
   forming a wiring over said contact electrode and said first insulating film and in contact with said contact electrode;
   forming a second insulating film over said wiring and said first insulating film;
   polishing a surface of said second insulating film by chemical mechanical polishing; and
   forming a thin film transistor over said surface of said second insulating film after said polishing.

8. The process of claim 7 wherein said surface has irregularities before said polishing.

9. A process for fabricating a semiconductor device comprising:
   forming a MOS transistor on a silicon substrate;
   forming an insulating film over said MOS transistor;

forming a contact hole in said insulating film;

forming a wiring which is electrically connected to said MOS transistor through said contact hole;

polishing a surface of said wiring and a surface of said insulating film by means of chemical mechanical polishing in an electrolytic solution using said wiring as an anode thereby simultaneously flattening said surface of said wiring and said surface of said insulating film; and forming a thin film transistor on said surface of said wiring and said insulating film after said polishing.

10. The process of claim 9 wherein said surface has irregularities before said polishing.

11. A process for fabricating a semiconductor device comprising:

forming a MOS transistor in a silicon substrate;

forming an insulating film over said MOS transistor;

forming a hole in said insulating film;

forming a wiring which is connected with said MOS transistor through said hole;

introducing an electrolytic solution onto a surface of said wiring and a surface of said insulating film through a plurality of openings provided in a cathode provided opposed to said surface of said wiring and said surface of said insulating film;

flattening said surface of said wiring and said surface of said insulating film at the same time by electrolytic polishing and chemical mechanical polishing using said wiring as an anode; and forming a thin film transistor over said surface of said insulating film after said flattening.

12. The process of claim 11 wherein said surface of said insulating film has irregularities before said flattening.

13. The process of claim 11 wherein said wiring has a protruded portion before said flattening.

14. The process of claim 11 wherein said wiring has a portion provided on said insulating film before said flattening.

15. A process for fabricating a semiconductor device comprising:

forming a first wiring or a first electrode over a substrate;

forming an insulating film which covers the first wiring or the first electrode and has surface irregularities;

forming a contact hole in said insulating film;

forming a wiring which is electrically connected to said first wiring or said first electrode through said contact hole;

polishing a surface of said wiring and a surface of said insulating film by means of chemical mechanical polishing in an electrolytic solution using said wiring as an anode thereby simultaneously flattening said surface of said wiring and said surface of said insulating film; and forming a thin film transistor over said surface of said wiring and said insulating film after said step of polishing.

16. The process of claim 15 wherein said surface has irregularities before said polishing.

17. A process for fabricating a semiconductor device comprising:

forming a MOS transistor in a silicon substrate;

forming a multilayer insulating film over said MOS transistor;

forming a hole in said multilayer insulating film;

forming a wiring which is connected with said MOS transistor through said hole;

introducing an electrolytic solution onto a surface of said wiring and a surface of said multilayer insulating film through a plurality of openings provided in a cathode provided opposed to said surface of said wiring and said surface of said multilayer insulating film;

polishing said surface of said multilayer insulating film and said surface of said wiring at the same time by chemical mechanical polishing in said electrolytic solution using said wiring as an anode; and forming a thin film transistor over said surface of said multilayer insulating film after said polishing.

18. The process of claim 17 wherein said surface has irregularities before said polishing.

19. A process for fabricating a semiconductor device comprising:

forming a MOS transistor in a silicon substrate;

forming a multilayer insulating film over said MOS transistor;

forming a hole in said multilayer insulating film;

forming a wiring which is connected with said MOS transistor through said hole;

introducing an electrolytic solution onto a surface of said wiring and a surface of said multilayer insulating film through a plurality of openings provided in a cathode provided opposed to said surface of said wiring and said surface of said multilayer insulating film;

flattening said surface of said wiring and said surface of said multilayer insulating film at the same time by electrolytic polishing and chemical mechanical polishing using said wiring as an anode; and forming a thin film transistor over said surface of said multilayer insulating film after said flattening.

20. The process of claim 19 wherein said surface of said multilayer insulating film has irregularities before said flattening.

21. The process of claim 19 wherein said wiring has a protruded portion before said flattening.

22. A process for fabricating a semiconductor device comprising:

forming a MOS transistor in a silicon substrate;

forming an insulating film over said MOS transistor;

forming a hole in said insulating film;

forming a wiring which is connected with said MOS transistor through said hole;

flattening a surface of said wiring and a surface of said insulating film at the same time by electrolytic polishing and chemical mechanical polishing; and forming a thin film transistor on said surface of said insulating film after said flattening, wherein said wiring is used as an anode for said electrolytic polishing.

23. The process of claim 22 wherein said surface of said insulating film has irregularities before said flattening.

24. The process of claim 22 wherein said wiring has a protruded portion before said flattening.

25. The process of claim 22 wherein said wiring has a portion provided on said insulating film before said flattening.

26. A process for fabricating a semiconductor device comprising:

forming a MOS transistor in a silicon substrate;

forming a multilayer insulating film over said MOS transistor;

forming a hole in said multilayer insulating film;

forming a wiring which is connected with said MOS transistor through said hole;

flattening a surface of said wiring and a surface of said multilayer insulating film at the same time by electrolytic polishing and chemical mechanical polishing; and forming a thin film transistor on said surface of said multilayer insulating film after said flattening, wherein said wiring is used as an anode for said electrolytic polishing.

27. The process of claim 26 wherein said surface of said multilayer insulating film has irregularities before said flattening.

28. The process of claim 26 wherein said wiring has a protruded portion before said flattening.

29. The process of claim 26 wherein said wiring has a portion provided on said multilayer insulating film before said flattening.

* * * * *